(12) United States Patent
Kimura et al.

(10) Patent No.: US 7,151,661 B2
(45) Date of Patent: Dec. 19, 2006

(54) CAPACITOR MODULE AND SEMICONDUCTOR DEVICE USING THE SAME

(75) Inventors: Tohru Kimura, Tokyo (JP); Dai Nakajima, Tokyo (JP); Yuuji Kuramoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 625 days.

(21) Appl. No.: 10/114,035

(22) Filed: Apr. 3, 2002

(65) Prior Publication Data

US 2002/0158329 A1 Oct. 31, 2002

(30) Foreign Application Priority Data

Apr. 25, 2001 (JP) .......................................... 2001-127939
Oct. 16, 2001 (JP) .......................................... 2001-317941

(51) Int. Cl.
*H01G 4/228* (2006.01)
*H01G 2/20* (2006.01)

(52) U.S. Cl. ................................ 361/306.3; 361/308.1; 361/782

(58) Field of Classification Search .............. 361/306.1, 361/306.2, 306.3, 308.1, 308.2, 308.3, 309, 361/311, 738, 772, 773, 774, 782, 760
See application file for complete search history.

(56) References Cited

U.S. PATENT DOCUMENTS 6,181,590 B1   1/2001   Yamane et al.
6,215,679 B1   4/2001   Yamane et al.

FOREIGN PATENT DOCUMENTS

| JP | 61-85886    | * | 5/1986  |
|----|-------------|---|---------|
| JP | 63-301585   |   | 12/1988 |
| JP | 10-304680   |   | 11/1998 |
| JP | 11-273984   |   | 10/1999 |
| JP | 2000-49042  | * | 2/2000  |
| JP | 2000-195753 |   | 7/2000  |
| JP | 2000-223355 |   | 8/2000  |
| JP | 2000-235931 |   | 8/2000  |
| JP | 2000-350474 |   | 12/2000 |

* cited by examiner

*Primary Examiner*—Eric W. Thomas
(74) *Attorney, Agent, or Firm*—Sughrue Mion, PLLC

(57) ABSTRACT

A capacitor module incorporating a ceramic capacitor having terminal members for reducing stress caused by thermal stress or electrostriction in the ceramic capacitor itself, and a semiconductor device using the capacitor module. The capacitor module and the semiconductor device are designed to have a reduced size and improved reliability. The semiconductor device has a power converter circuit constituted by switching devices and diodes, a P-polarity conductor and an N-polarity conductor for supplying electric power to the power converter circuit, a ceramic capacitor having two external electrodes, flexible terminal members connected to the external electrodes, a heat radiation plate provided at the bottom of a case, an insulating resin with which the power converter circuit is covered, a P-polarity connection conductor for connection between the terminal member on one side of the ceramic capacitor and the P-polarity conductor, an N-polarity connection conductor for connection between the terminal member on the other side of the ceramic capacitor and the N-polarity conductor, and a molded wiring plate on which a major surface of the ceramic capacitor is supported.

17 Claims, 16 Drawing Sheets

FIG. 21
(a)
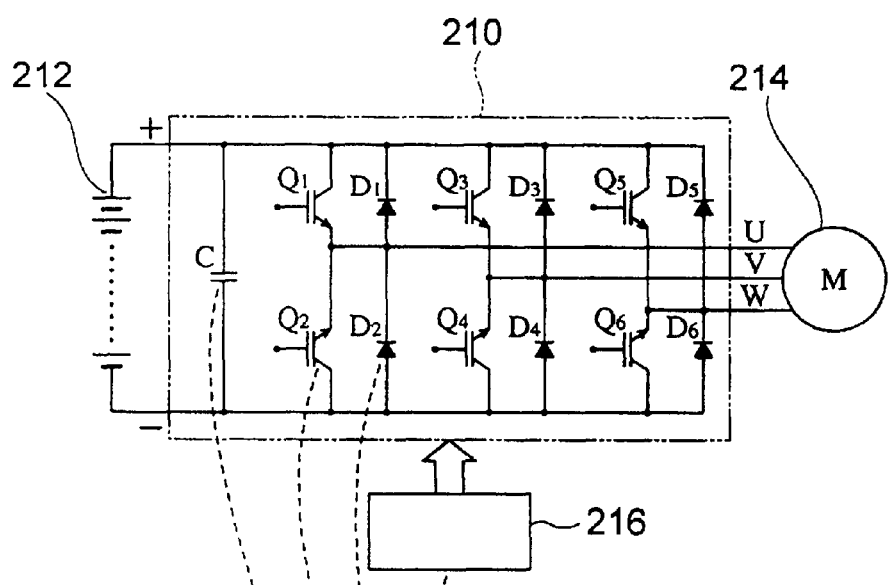
(b)
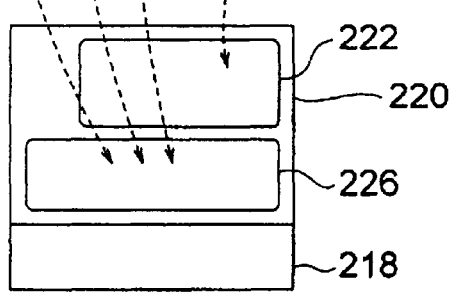

CAPACITOR MODULE AND SEMICONDUCTOR DEVICE USING THE SAME

BACKGROUND OF THE INVENTION

1. Field of the Invention

The present invention relates to a capacitor module and a semiconductor device using the capacitor module, and more particularly to a capacitor module used to construct an inverter device and to a semiconductor device using the capacitor module.

2. Description of the Related Art

Inverters are widely used in various kinds of consumer-oriented or industrial electronic appliances. For example, in an electric vehicle propelled by an a.c. motor or a hybrid car propelled by an internal combustion engine and an a.c. motor, an inverter 101 (hereinafter referred to as related art 1) is interposed between the motor and a d.c. power supply, as shown in FIG. 20. As shown in a plan view of FIG. 18 and a cross-sectional view of FIG. 19, the inverter 101 is constituted by a semiconductor device 102 and a smoothing capacitor 110 placed outside the semiconductor device 102. The smoothing capacitor 110 is required to reduce ripple voltage changes in the d.c. power supply. The semiconductor device 102 coverts d.c. current into a.c. current by switching devices 120 and diodes 121 mounted on an insulating board 125 or, conversely, converts a.c. current into d.c. current. If a three-phase a.c. motor is used, the semiconductor device 102 has three phases: a U phase 140, a V phase 141, and a W phase 142. The insulating board 125 is mounted on a heat radiation plate 160 which is fixed on a case 150 formed of a synthetic resin. A plurality of conductors for internal wiring are embedded in the case 150 by insert molding. The conductors have exposed their portions in the surface of the case 150, which form a P terminal 130 and an N terminal 131 on the d.c. side and a U terminal 132, a V terminal 133, and a W terminal 134 on the a.c. side. Also, the conductors are connected to the switching devices 120 and diodes 121 by a wiring pattern and aluminum wires (not shown) formed on the surface of the insulating board 125, thereby forming the circuit shown FIG. 20. A d.c. power supply is connected to the P terminal 130 and the N terminal 131. A three-phase a.c. motor is connected to the U terminal 132, V terminal 133, and the W terminal 134 on the a.c. side.

As mentioned above, the smoothing capacitor 110 is provided outside the semiconductor device 102 when the semiconductor device constitutes the inverter in the related art 1. For this reason, the wiring lines between the smoothing capacitor 110 and the switching devices 120 in the semiconductor device 102 are long and the inductance thereof is large. A high surge voltage can be caused under such a condition. Therefore there is a need to increase a withstand pressure of the semiconductor elements and an increase in manufacturing cost is inevitable. Since the inductance is increased, it is necessary to increase capacitance of the smoothing capacitor 110 in order to reduce ripples in the voltage of the d.c. power supply. Therefore, the smoothing capacitor 110 must be increased in size, resulting in an increase in overall size of the inverter 101.

Ordinarily, an electrolytic capacitor in a cylindrical form or the like is used as a capacitor having large capacitance. If such a capacitor is used, it is difficult to efficiently use the space. This is a hindrance to reducing the size of the inverter 101.

Japanese Patent Application Laid-open No. 10-304680 discloses use of a ceramic capacitor as a smoothing capacitor to reduce the size of a semiconductor device, and a structure in which the ceramic capacitor is placed in the vicinity of switching devices inside the semiconductor device (related art 2). FIGS. 21 to 23 show the configuration of a conventional power converter device described in the specification disclosed in this publication.

In an embodiment of the power converter device disclosed in Japanese Patent Application Laid-open No. 10-304680, a ceramic capacitor C is used as a smoothing capacitor and mounted on a switching device board 226 on which insulated gate bipolar transistors (IGBTs), etc., are mounted. The ceramic capacitor C is cooled with a cooling member 218, with which the IGBTs, etc., are also cooled. More specifically, as shown in FIG. 22, the ceramic capacitor C having the shape of a substantially rectangular block is placed horizontally position between power supply wiring conductors on the plus and minus sides (hereinafter referred to as P-polarity conductor 236P and N-polarity conductor 236N). Alternatively, the ceramic capacitor C is placed vertically, as shown in FIG. 23. Three ceramic capacitors connected in parallel with each other may be provided in one-to-one relationship with the three phases to realize a smoothing capacitor.

One of the advantages of use of a ceramic capacitor as a smoothing capacitor is that a ceramic capacitor has an internal resistance smaller than that of electrolytic capacitors and enables limitation of the capacitance to a necessary value for smoothing, while in the related art the capacitance is set to a comparatively large value for absorption of a ripple voltage. More specifically, the necessary capacitance of the smoothing capacitor can be limited to several hundred microfarads, while the necessary capacitance in the related art is several ten millifarads. Consequently, the smoothing capacitor can be reduced in size.

The above-described structure has a problem relating to a method of connection between the ceramic capacitor C and each of the P-polarity conductor 236P and the N-polarity conductor 236N. A case will be discussed where three ceramic capacitors connected in parallel constitute a smoothing capacitor in the manner disclosed in the above-mentioned publication in the described example of the inverter device mounted in an electric vehicle.

In the specification disclosed in the above-mentioned publication, it is stated that the capacitance necessary for smoothing can be limited to several hundred microfarads if a ceramic capacitor is used as a smoothing capacitor. However, the external size of one ceramic capacitor in a case where three ceramic capacitors are connected in parallel with each other as described in the disclosed specification to realize such capacitance is thought to be at least several ten millimeters square.

The method of connecting the ceramic capacitor C and each of the P-polarity conductor 236P and the N-polarity conductor 236N is not described in detail in the above-mentioned publication, but the ceramic capacitor C and each of the P-polarity conductor 236P and the N-polarity conductor 236N in the state as understood from FIGS. 22 and 23 are connected to each other with their surfaces facing each other. From the viewpoint of mounting on a electric vehicle, it is thought that it is necessary for the connected surfaces to be maintained in the connected state with reliability even when they are caused to vibrate, and it is also necessary for the connected surface to be not only in contact with each other but also in a state of being firmly fixed to each other. Also, while it is necessary to apply a substantially high pressure to the contact surfaces in order to ensure reliable connection by contact, no devise is made to apply a contact pressure to the contact surfaces in the art as understood from the disclosure in the above-mentioned publication, and it can easily be conjectured that the art was proposed with mere fixation of the connected surfaces imagined.

Further, to make the best possible use of the capacitance of a ceramic capacitor, it is necessary to maximize the uniformity of the current density in the ceramic capacitor. For this effect, it is necessary that each of the P-polarity conductor 236P and the N-polarity conductor 236N be connected to substantially the entire surface of an external electrode of the ceramic capacitor, or that the connection be distributed uniformly on substantially the entire area of the external electrode of the ceramic capacitor.

Ordinarily, a metal such as copper having a high electrical conductivity and low-priced is used as the material of the P-polarity conductor 236P and the N-polarity conductor 236N to which the ceramic capacitor is connected.

For the above-described reasons, it is required for implementation of the related art disclosed in the above-mentioned publication that materials differing in the liner expansion coefficient, i.e., a ceramic and a metal, be connected in such a state that the area of contact therebetween is several ten millimeters square. In implementation of the related art under this requirement, occurrence of considerable thermal stress in portions of the two members jointed to each other cannot be avoided. For example, in the case of the inverter device mounted in an electric vehicle, which is described as an example in the specification disclosed in the above-mentioned publication, the inverter device has an operating temperature range from −40 degrees to 125 degrees and the components are subjected to repeated thermal action due to variation in temperature in this range. In such a situation, it is inevitable that the joint or the ceramic capacitor itself is seriously damaged by thermal stress caused by the thermal action.

Further, in a case where a multilayer ceramic capacitor, e.g., one using a barium titanate ceramic as a dielectric is used at a high voltage or in a high frequency region in particular, electrostriction can occur easily due to a piezoelectric phenomenon of the dielectric provided in the capacitor main body. The amount of electrostriction is particularly large if the capacity of the multilayer ceramic capacitor is large. If, in a situation where such electrostriction is caused, the connection members are joined to the external electrodes in a state of having the joint surfaces faced to each other in the manner described with respect to the related art disclosed in the above-mentioned publication, displacement of the capacitor body due to electrostriction is restricted comparatively strongly by the connection members to reduce the escape of the stress due to electrostriction by a comparatively large amount. There is a possibility of damage to the ceramic capacitor resulting from such a condition.

However, it is thought that the structure disclosed in Japanese Patent Application Laid-open No. 10-304680 was designed with no consideration of such stress due to heat or electrostriction.

Japanese Patent Application Laid-open Nos. 2000-223355 and 2000-235931 disclose structures (referred to as related arts 3 and 4, hereinafter) which were designed to avoid problems of thermal stress and electrostriction such as those described above, and in which a terminal member made of a metal plate is provided as the external electrode of the ceramic capacitor to reduce, by deformation of the terminal member including bending, stress acting on the joint and the ceramic capacitor main body. In the art disclosed in Japanese Patent Application Laid-open No. 10-304680 however, no application of a ceramic capacitor having such a terminal member is supposed. No guide to a method of application of such a ceramic capacitor can be obtained from the related art. Also, ceramic capacitors disclosed in Japanese Patent Application Laid-open Nos. 2000-223355 and 2000-235931 are assumed to be connected to a planar member such as a printed board without supposition of interposition between conductors opposed to each other as shown in FIGS. 22 and 23 in Japanese Patent Application Laid-open No. 10-304680. No guide to a method of such application can be obtained from these related arts.

Further, if P-polarity and N-polarity conductors are placed along a plane in an application of the ceramic capacitor disclosed in Japanese Patent Application Laid-open No. 2000-223355 or 2000-235931, the ceramic capacitor is in a horizontal position. Note that the term "horizontal position" refers to a state in which the ceramic capacitor is positioned so that one of the surfaces of the ceramic capacitor having the largest area (referred as a major surface, hereinafter) is horizontally arranged. Alternatively, the ceramic capacitor may be in a vertical position. The major surface of the ceramic capacitor in this position is perpendicular to the surface on which the ceramic capacitor is mounted. If the size of the ceramic capacitor is several ten millimeters square, and if the ceramic capacitor is in the horizontal position, the size of the semiconductor device is considerably large. To avoid this, the ceramic capacitor is vertically positioned, or placed above the power converter circuit. However, it is difficult for each of the ceramic capacitors disclosed in Japanese Patent Application Laid-open No. 2000-223355 or 2000-235931 to be connected to the P-polarity and N-polarity conductors while being maintained in a position other than the horizontal position. Thus, the degree of freedom of positioning the capacitor is low.

Even if portions of the P-polarity and N-polarity conductors are raised upright as shown in FIG. 23 in the art disclosed in Japanese Patent Application Laid-open No. 10-304680, it is necessary to devise some means for enabling joining of the ceramic capacitor to the vertical surfaces, e.g., means for supporting the ceramic capacitor before the ceramic capacitor is connected and fixed, or a method of changing the orientation of the semiconductor device to horizontally maintain the portion to which the ceramic capacitor is connected. In such a case, troublesome operations are required and an increase in manufacturing cost of the semiconductor device are caused.

The ceramic capacitor and the terminal members are connected by soldering. If the same solder as that for the connection between the ceramic capacitor and the terminal members is used to connect the ceramic capacitor and the P-polarity and N-polarity conductors, there is a risk of the solder for the connection between the ceramic capacitor and the terminal members being molten to allow shifting of the joint positions or disconnection of the ceramic capacitor and the terminal members.

In the related art 1, as described above, the wiring lines between the smoothing capacitor and the switching devices are long, the inductance thereof is large, and there is a need to increase the capacitance of the smoothing capacitor, so that the size of the smoothing capacitor is increased. In the related art 2, a ceramic capacitor is therefore used to achieve a reduction in size but there is a possibility of the ceramic capacitor being broken when stressed by thermal stress or electrostriction since the ceramic capacitor and each of the P-polarity conductor and the N-polarity conductor are connected with their surfaces facing each other. Each of the related arts 3 and 4 is a certain measure of success in solving the stress problem. In each of these arts, however, the degree of freedom with which the capacitor is positioned when mounted in a semiconductor device or the like is low and an increase in size of the semiconductor device cannot be avoided.

SUMMARY OF THE INVENTION

In view of the above-described problems, an object of the present invention is to provide a capacitor module capable of withstanding thermal stress acting on a ceramic capacitor and to stress caused by electrostriction in the ceramic capacitor, and having a higher degree of freedom of layout.

Another object of the present invention is to provide a semiconductor device constructed by using the capacitor module so as to have improved reliability and to be smaller in size.

With the above objects in view, the capacitor module of the present invention comprises: a ceramic capacitor having major surfaces facing in opposite directions, side surfaces facing in other opposite directions, and external electrodes respectively provided on the side surfaces facing in other opposite directions; terminal members respectively joined to the external electrodes of the ceramic capacitor, the terminal members having electrical conductivity and flexibility; a P-polarity connection conductor which connects the terminal member on one side of the ceramic capacitor to a P-polarity conductor provided outside; an N-polarity connection conductor which connects the terminal member on the other side of the ceramic capacitor to an N-polarity conductor provided outside; and a wiring plate provided with the P-polarity connection conductor and the N-polarity connection conductor, the major surface of the ceramic capacitor being supported on the wiring plate.

A flexible member may be disposed between the ceramic capacitor and the wiring plate.

Also, each of the P-polarity connection conductor and the N-polarity connection conductor may be formed integrally with the terminal member.

The P-polarity connection conductor and the N-polarity connection conductor may be placed parallel to each other by being spaced apart by a predetermined distance, with an insulating layer disposed therebetween.

Further, the present invention also resides a semiconductor device using the capacitor module described above.

BRIEF DESCRIPTION OF THE DRAWINGS

FIGS. 21(a) and 21(b) explain a circuit structure of another conventional inverter and a mounted state of the inverter;

DESCRIPTION OF THE PREFERRED EMBODIMENTS

Embodiment 1

Figure 1:
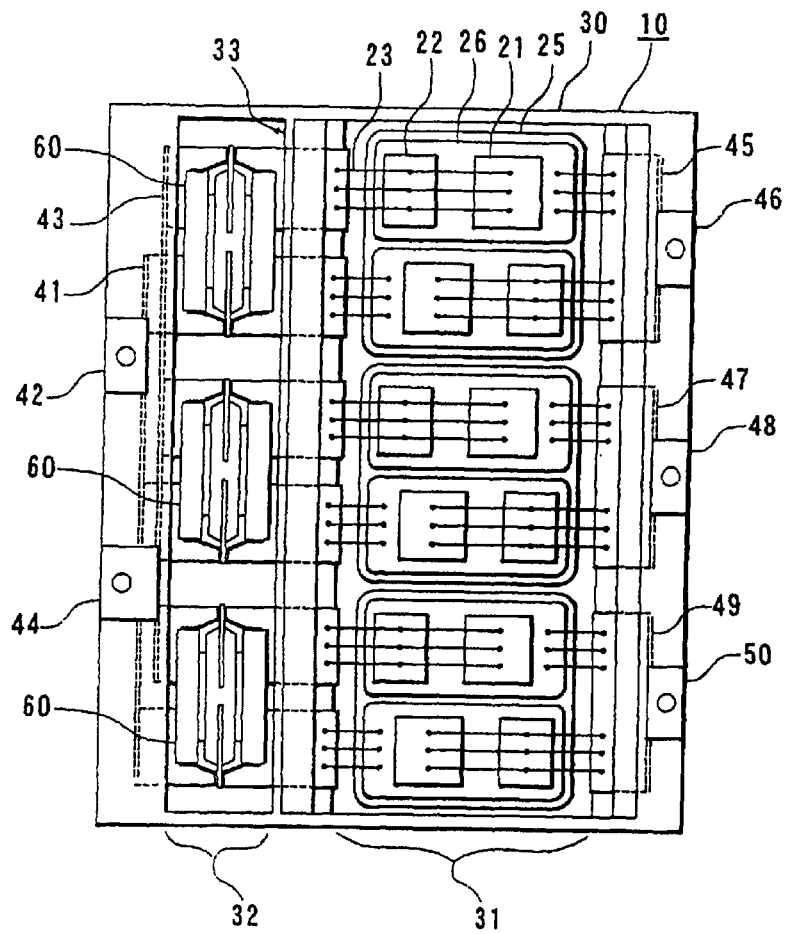
FIG. 1 is a top perspective view of a structure of a semiconductor device in Embodiment 1 of the present invention.
Figure 2:
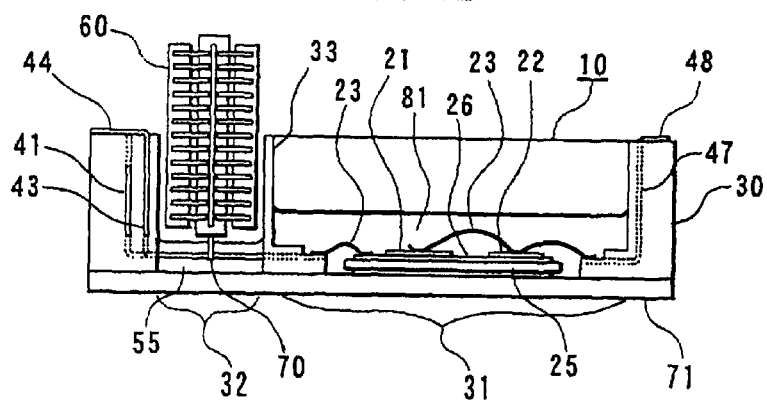
FIG. 2 is a sectional side view of the structure of the semiconductor device in Embodiment 1 of the present invention.
Figure 3:
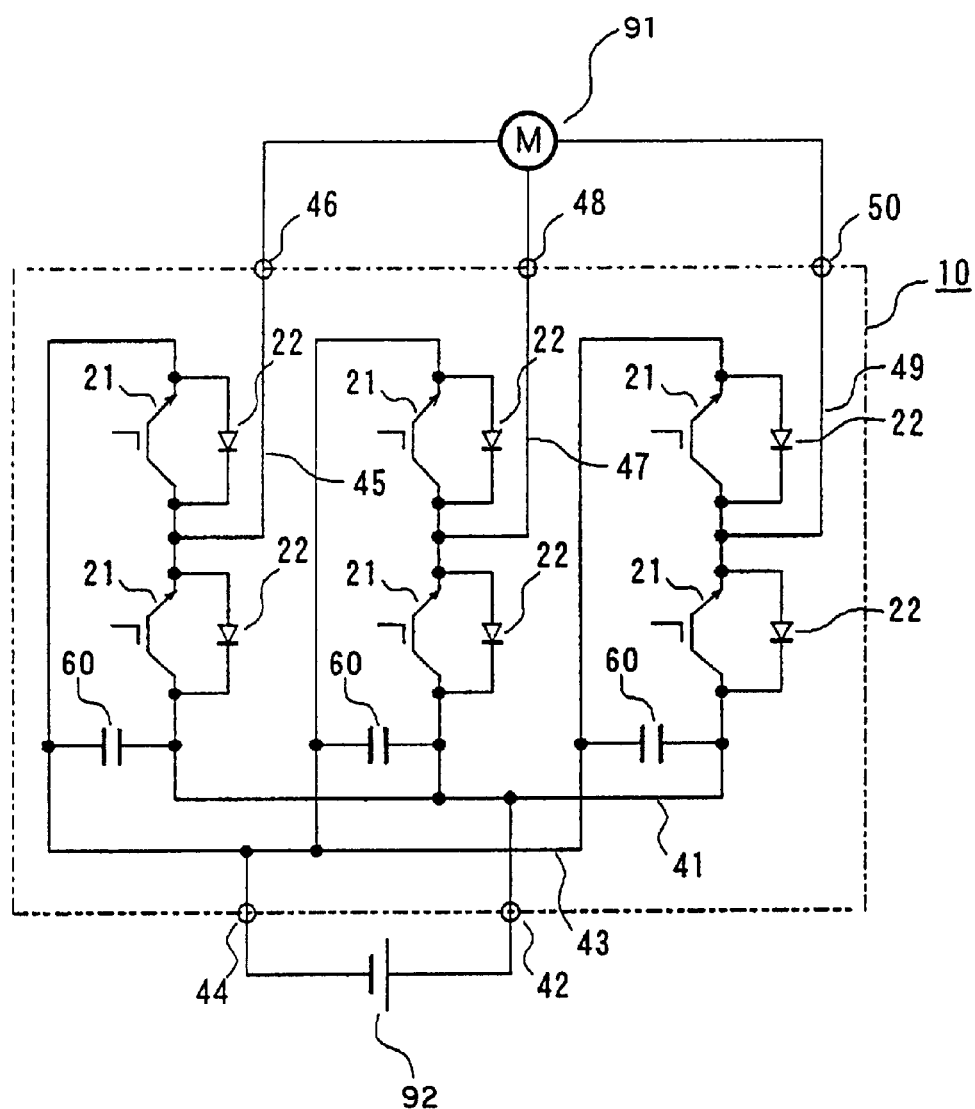
FIG. 3 is a circuit diagram of the semiconductor device in Embodiment 1 of the present invention.

A capacitor module and a semiconductor device in Embodiment 1 of the present invention will be described with reference to the perspective top view of FIG. 1 showing the structure of the semiconductor device, the sectional side view of FIG. 2, and the circuit diagram of FIG. 3. In this embodiment, as shown in FIG. 1, six IGBTs (switching devices) 21 and six diodes 22 are soldered to a copper wiring pattern 26 formed on an upper surface of an insulating board 25 made of a ceramic such as aluminum nitride. The IGBTs 21 and the diodes 22 constitute a power converter circuit having a plurality of phases (three phases in the example shown in FIG. 1). The IGBTs 21 and the diodes 22 are placed by being alternately reversed in position. That is, the orientation and the order in which one IGBT 21 and one diode 22 in each of six combinations of IGBTs 21 and the diodes 22 are placed are reversed with respect to every other combination. Power is supplied to the power converter circuit in each phase through a P-polarity conductor 41 and an N-polarity conductor 43. The insulating board 25 is soldered to a heat radiation plate 71, as shown in FIG. 2. Heat generated by the IGBTs 21 and the diodes 22 is conducted to the heat radiation plate 71 through the insulating board 25, and the heat radiation plate 71 is cooled by a cooling means (not shown) placed under the lower surface of the heat radiation plate 71.

A case 30 is a member molded of a synthetic resin such as polyphenylene sulfide (PPS) with the P-polarity conductor 41, the N-polarity conductor 43, a U-polarity conductor 47, a V-polarity conductor 47, and a W-polarity conductor 49 embedded in and integrally combined with the resin. The conductors 41, 43, 45, 47, and 49 respectively have exposed portions in surfaces of the case 30, which portions form a P-polarity terminal 42, an N-polarity terminal 44, a U-polarity terminal 46, a V-polarity terminal 48, and a W-polarity terminal 50. As shown in FIG. 3, a d.c. power supply 92 is connected to the P-polarity terminal 42 and the N-terminal terminal 44, and a three-phase a.c. motor 91 is connected to the U-polarity terminal 46, the V-polarity terminal 48, and the W-polarity terminal 50.

The P-polarity conductor 41 and the N-polarity conductor 43 have exposed portions in an internal surface of the case 30, and capacitor modules 60 which function as a smoothing capacitor are connected to the exposed portions. In this embodiment, each capacitor module 60 is placed in a vertical position, as shown in FIG. 2, thereby enabling the area of the bottom of the capacitor module 60 to be reduced (in comparison with the bottom area in a case where the capacitor module is placed in a horizontal position). The structure of the capacitor modules 60 and the method of connecting the capacitor modules 60 to the P-polarity conductor 41 and the N-polarity conductor 43 will be described below in detail. These respective components are connected by aluminum wires 23 to realize the circuit configuration shown in FIG. 3.

Figure 4:
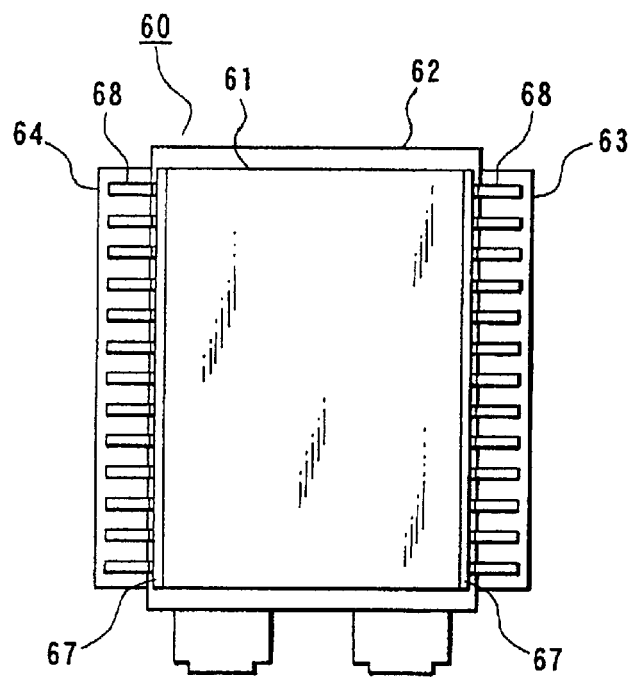
FIG. 4 is a front view of the structure of a capacitor module 60 in Embodiment 1 of the present invention.
Figure 5:
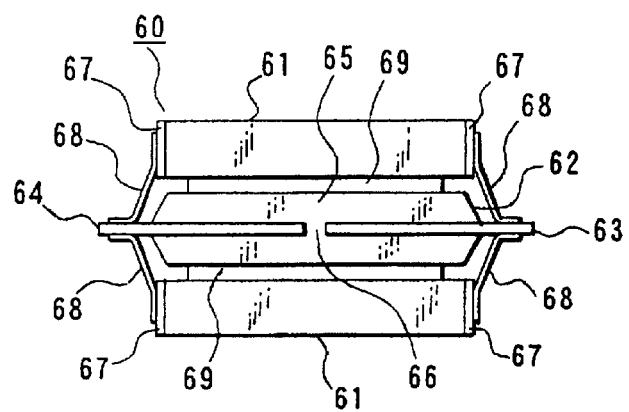
FIG. 5 is a sectional top view of the structure of the capacitor module 60 in Embodiment 1 of the present invention.
Figure 6:
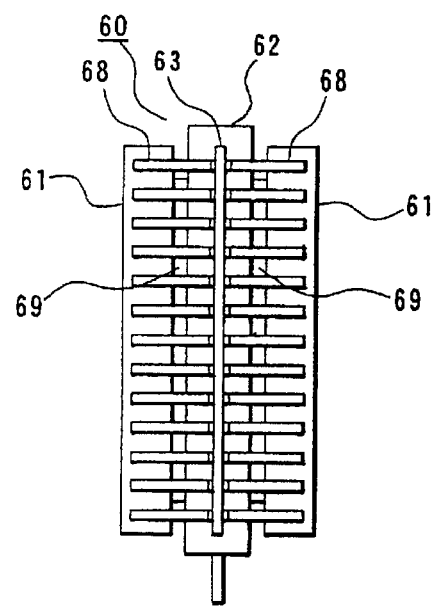
FIG. 6 is a side view of the structure of the capacitor module 60 in Embodiment 1 of the present invention.

FIGS. 4, 5, and 6 are a front view, a cross-sectional view seen from above, and a side view of the structure of the capacitor module 60, respectively. The capacitor module 60 is constituted by a pair of ceramic capacitors 61 each having a substantially rectangular shape and having major surfaces facing in opposite directions and side surfaces facing in other opposite directions, and by a molded wiring plate 62 on which the major surface of each ceramic capacitor 61 is supported. Further, the molded wiring plate 62 is constituted by a P-polarity connection conductor 63 and an N-polarity connection conductor 64 each made of a metal such as copper or aluminum having a high electrical conductivity and a high thermal conductivity, and by a synthetic resin 65 for molding these so that the conductors are embedded in and integrally combined with the resin. Each of the P-polarity connection conductor 63 and the N-polarity connection conductor 64 has one side end portion and a lower end portion exposed out of the molded synthetic resin 65. An insulating layer 66 made of the synthetic resin 65 is formed between the P-polarity connection conductor 63 and the N-polarity connection conductor 64.

Each ceramic capacitor 61 in the form of a block which functions as a smoothing capacitor is connected to the side end portions of the P-polarity connection conductor 63 and the N-polarity connection conductor 64 exposed out of the mold. External electrodes 67 are formed on the side surfaces of the ceramic capacitor 61 facing in opposite directions. One end of each terminal member 68 formed of, for example, a metal plate and having a high electrical conductivity is soldered to each of the external electrodes 67. The other end of each terminal member 68 is solid-phase-joined by ultrasonic pressure joining or the like to the portion of the P-polarity connection conductor 63 or the N-polarity connection conductor 64 exposed out of the mold. The terminal members 68 having a certain degree of flexibility are provided for the purpose of reducing stress. For example, the terminal members 68 may have a structure such as the one disclosed in Japanese Patent Application Laid-open No. 2000-235931, in which projections (not shown) projecting toward the external electrode 67 and the P-polarity connection conductor 63 or N-polarity connection conductor 64 are included, and in which each joint portion of the terminal member 68 extends substantially linearly along a portion of the external electrode 67, the P-polarity connection conductor 63 and the N-polarity connection conductor 64. Further, the terminal members 68 may have any other structure as long as they are flexible. The terminal members 68 may have a structure such as that shown in FIGS. 4 to 6. That is, as is apparent from FIGS. 4 to 6, each terminal member 68 has the shape of a strip and is worked so as to have its opposite end portions respectively bent by a predetermined angle, and so as to enable at least the angled portions to be brought into contact with the mated joint surfaces (the capacitor and the terminal members forming a bathtub-like sectional configuration in this embodiment), as shown in the top sectional view of FIG. 5. The arrangement for reduction of stress may be such that portions of each terminal member 68 are soldered to the external electrode 67 and the P-polarity connection conductor 63 or N-polarity connection conductor 64 so as to extend substantially linearly along portions of the external electrode 67 and the P-polarity connection conductor 63 or N-polarity connection conductor 64; each terminal member 68 is formed of a flexible metallic member; or each terminal member 68 is formed so as to have a spring structure for exhibiting flexibility. The synthetic resin 65 and the ceramic capacitor 61 are bonded to each other by an underfill 69 interposed therebetween. The underfill 69 has a high thermal conductivity, a high adhesive strength, and flexibility. The lower ends of the P-polarity connection conductor 41 and the N-polarity conductor 43 exposed out of the mold are welded to the P-polarity conductor 63 and the N-polarity connection conductor 64 at connection portions 70 (see FIG. 2).

A power converter circuit unit 31 in which the IGBTs 21, the diodes 22 and the insulating board 25 are accommodated and a capacitor unit 32 in which the capacitor modules 60 are accommodated are separated from each other by a partition member 33 provided in the case 30. To cover the power converter circuit, the power converter circuit unit 31 is filled with a low-priced flexible insulating resin 81 such as silicone gel, which is selected without considering the thermal conductivity, and which has a thermal conductivity of about 0.15 W/mK, as is an ordinary semiconductor device. The capacitor unit 32 is filled with an insulating resin 55 such as silicone gel in which a filler having a high thermal conductivity is mixed.

Part of heat generated by the ceramic capacitor 61 is conducted to the P-polarity connection conductor 63 and the N-polarity connection conductor 64 through the terminal members 68, and another part of the heat is conducted to the P-polarity connection conductor 63 and the N-polarity connection conductor 64 through the underfill 69 and the synthetic resin 65. The heat conducted to the P-polarity connection conductor 63 and the N-polarity connection conductor 64 is further conducted to the P-polarity conductor 41 and the N-polarity conductor 43 through the connections 70 and to the heat radiation plate 71 through the insulating resin 55 with which the capacitor unit 32 is filled, and which has a high thermal conductivity. The heat radiation plate 71 is cooled by the cooling means (not shown) placed under the lower surface of the heat radiation plate 71.

In the assembly process, the insulating board 25 on which the IGBTs 21 and the diodes 22 are mounted is mounted on the heat radiation plate 71 and is thereafter cleansed of flux. The case 30 to which the capacitor modules 60 have been connected and the heat radiation plate 71 are then connected by being fastened to each other by suitable means (not shown), e.g., screws or bonding with an adhesive. The power converter circuit unit 31 is filled with the insulating resin 81 and the capacitor unit 32 is filled with the insulating resin 55.

In this embodiment, the ceramic capacitors having terminal members 68 for solving the stress problem are used and a portion of each ceramic capacitor other than those connected to the terminal members 68 is connected to one or both of the P-polarity connection conductor and the N-polarity connection conductor directly or through an insulating member (synthetic resin 65). Thus, a possibility of damage to the ceramic capacitor 61 by stress due to heat or electrostriction is eliminated to improve the reliability of the device. After cleansing for removing flux has been performed on the insulating board 25 on which the IGBTs 21 and the diodes 22 are mounted and which is mounted on the heat radiation plate 71, the case 30 is fixed to the insulating board 25, and thus the case 30 is not cleansed. Therefore there is no possibility of conductors integrally combined by molding in the case 30 being contaminated and damaged by the adverse effect of cleansing. Therefore occurrence of poor connection of the aluminum wires 23 is reduced and a reduction in reliability of the aluminum wire 23 connection can be prevented. Also, since the ceramic capacitor 61 is not directly soldered to the P-polarity conductor 41 and the N-polarity conductor 43 in the semiconductor device 10, there is no possibility of each of the P-polarity conductor 41 and the N-polarity conductor 43 being contaminated and damaged by flux. Therefore occurrence of poor connection of the aluminum wires 23 is reduced and a reduction in reliability of the aluminum wire 23 connection can be prevented.

The ceramic capacitor 61 is connected to the molded wiring plate 62 which is simple in shape and easy to handle. Therefore there is substantially no restrictions on connecting operations and the degree of freedom of connection is increased. In a connection process based on any connection method, the facility with which connecting operations are performed can be improved.

The terminal members 68, the P-polarity connection conductor 63, the N-polarity connection conductor 64, the P-polarity conductor 41, and the N-polarity conductor 43 are used not only as a current path but also as a heat-transfer path for cooling the ceramic capacitor 61, thereby making it possible to reduce the size of the capacitor and, hence, the size of the semiconductor device. From the viewpoint of this cooling effect, copper or aluminum is said to be suitably used as the material of the above-described members. However, any other material may be used if it is sufficiency high in electrical conductivity and wire bondable or weldable.

The synthetic resin 65 forming the molded wiring plate 62 and the ceramic capacitor 61 are bonded to each other by underfill 69 such as silicone rubber having high thermal conductivity, high bonding strength and flexibility. The ceramic capacitor 61 is supported on the molded wiring plate 62 in this manner. Therefore no excessive load is imposed on the terminal members 68 low in rigidity under any layout condition and the degree of freedom of placing the ceramic capacitor 61 is improved. This supporting method contributes to the effect of improving the resistance to vibration as well as to the reduction in size of the semiconductor device 10. Further, the synthetic resin 65 and the underfill 69 are used not only as a molded member and an adhesive but also as a heat-transfer path for cooling the ceramic capacitor 61. The ability to cool the ceramic capacitor 61 is thereby improved to achieve a reduction in size of the capacitor and, hence, a reduction in size of the semiconductor device. From the viewpoint of reducing the thermal resistance, it is desirable to minimize the thickness of the underfill 69 while maximizing the bonding area. However, it is necessary that the underfill 69 have a certain degree of flexibility to reduce thermal stress due to the difference between the linear expansion coefficients of the ceramic capacitor 61 and the molded wiring plate 62. Silicone rubber may be mentioned as an example of a material having such characteristics but it is not exclusively used. Any other material having high adhesion, high electrical conductivity, and flexibility may be used. Note that if sufficiently high cooling ability can be ensured only by the heat-transfer path from the terminal members 68 to the P-polarity connection conductor 63 and the N-polarity connection conductor 64, low-priced materials may be selected as the synthetic resin 65 and underfill 69 without specially considering the heat conductivity of the materials.

The terminal members 68 are joined to the P-polarity connection conductor 63 and the N-polarity connection conductor 64 in a solid phase joining manner by ultrasonic pressure joining. The ultrasonic pressure joining enables joining by applying a pressure and ultrasonic vibration to the joint, and is generally used for an aluminum wire pound. This joining method requires no heating for increasing the temperature of the members to be joined and joins the members in the solid phase without melting the members. Therefore this method is called solid phase joining. This method enables connection between the terminal members 68 and the P-polarity and N-polarity connection conductors 63 and 64 without melting the solder connecting the external electrodes 67 of the ceramic capacitor 61 and the terminal members 68, thereby preventing the terminal members 68 from shifting or coming off and thus improving the facility with which the components are assembled.

The lower ends of the P-polarity connection conductor 63 and the N-polarity connection conductor 64 exposed out of the mold are connected at the connection 70 to the P-polarity conductor 41 and the N-polarity conductor 43 by welding. Therefore there is no need to use any special member for connection and the effect of reducing the number of component parts and the manufacturing cost is achieved. A reduction in the time required to connect the members also contributes to the cost reduction effect. Further, since there is no interface impeding conduction of heat at the connection, the thermal conductivity is improved and heat generated by the ceramic capacitor 61 can be conducted to the P-polarity conductor 41 and the N-polarity conductor 43 through the path with a reduced thermal resistance. The ability to cool the ceramic capacitor 61 is thereby improved, so that the capacitor and the semiconductor device can be reduced in size. The process step for welding is performed before the case 30 and the heat radiation plate 71 are fixed to each other. In this embodiment, the place for the connection 70 is selected to ensure ease of welding from the bottom side of the case 30 before fixation of the heat radiation plate 71.

Since the capacitor unit 32 is filled with the insulating resin 55 having high thermal conductivity, a sufficiently high insulation withstand pressure can be obtained even if the insulation distance between the P-polarity and N-polarity conductors 41 and 43 and the heat radiation plate 71 is small. This insulation not only contributes to the reduced size of the semiconductor device 10 but also reduces the thermal resistance of the heat-transfer path from the P-polarity and N-polarity conductors 41 and 43 to the heat radiation plate 71. Thus, it is possible to improve the ability to cool the ceramic capacitor 61 and to reduce the size of the capacitor and, hence, the size of the semiconductor device.

Since the power converter circuit unit 31 and the capacitor unit 32 are separated from each other by the partition member 33 provided in the case 30, the high-priced insulating resin 55 having high thermal conductivity can be used to fill the capacitor unit 32 only. The low-priced insulating resin 81 selected without considering the thermal conductivity as in ordinary semiconductor devices can be used for power converter circuit unit 31. A reduction in manufacturing cost can be achieved thereby.

Further, in the heat conducting structure of this embodiment, the heat-transfer area is increased by horizontally diffusing heat through the P-polarity and N-polarity conductors 41 and 43 to conduct heat to the heat radiation plate 71 with reduced thermal resistance. Further, to reduce the thermal resistance, the distance between the P-polarity and N-polarity conductors 41 and 43 and the heat radiation plate 71 is minimized within such a range that the insulation withstand pressure is ensured.

Needless to say, while in this embodiment six ceramic capacitors 61 connected to the two surfaces of the molded wiring plates 62 are provided, the number of ceramic capacitors 61 is not limited to a particular number and can be freely selected provided that the necessary capacitance of the smoothing capacitor can be obtained.

In this embodiment, as described above, terminal members formed of metallic plates for reducing stress caused by thermal stress acting on the ceramic capacitor or electrostriction in the ceramic capacitor itself are used, thereby making it possible to obtain a capacitor module having improved reliability, a high degree of freedom of layout and capable of forming a vertical structure. Further, it is possible to obtain a small, high-performance, easily assembled, reliable and low-priced semiconductor device by incorporating the capacitor module.

Embodiment 2

Figure 7:
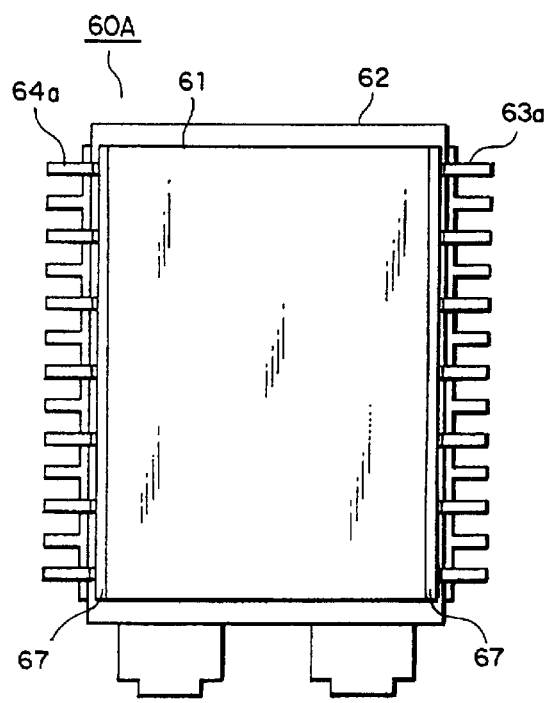
FIG. 7 is a front view of a structure of a capacitor module 60 in Embodiment 2 of the present invention.
Figure 8:
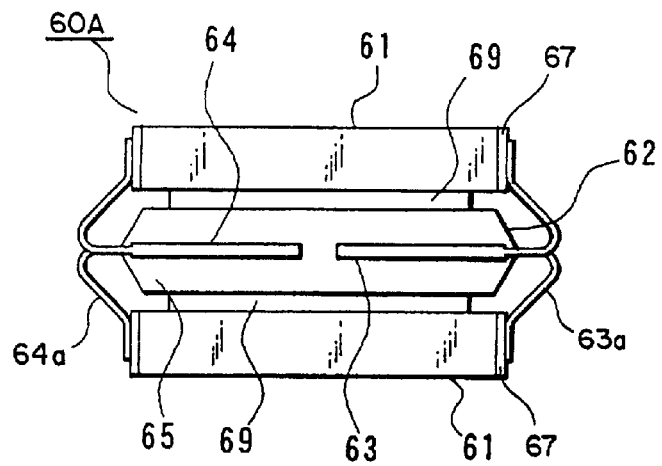
FIG. 8 is a sectional top view of the structure of the capacitor module 60 in Embodiment 2 of the present invention.
Figure 9:
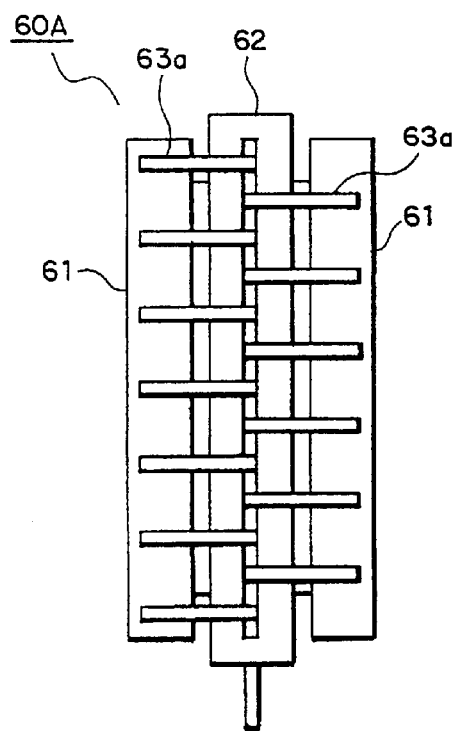
FIG. 9 is a side view of the structure of the capacitor module 60 in Embodiment 2 of the present invention.

FIG. 7 is a front view of the structure of a capacitor module 60A in Embodiment 2 of the present invention. FIG. 8 is a sectional view of the capacitor module seen from above, and FIG. 9 is a side view of the capacitor module. In this embodiment, as shown in FIGS. 7, 8, and 9, side end portions 63a and 64a of the P-polarity connection conductor 63 and the N-polarity conduction conductor 64 exposed out of the synthetic resin 65 are formed by rolling to have a reduced thickness and a small rigidity. The side end portions 63a and 64a are worked and bent so as to be brought into contact with mated connection surfaces to which they are to be soldered, and are soldered to the external electrodes 67 of the ceramic capacitors 61, as are the terminal members 68 illustrated in the above-mentioned FIG. 5. A resin such as PPS having heat resistance high enough to withstand heating at the soldering joint temperature is used as the synthetic resin 65 to prevent heat deformation of the molded wiring plate 62. In this embodiment, end portions of the P-polarity and N-polarity connection conductors 63 and 64 are extended to be used instead of the terminal members 68 described above with respect to Embodiment 1 (in other words, the terminal members are integrally formed). The number of connections is reduced by removing the terminal members 68 to improve the reliability of connection. Also, the manufacturing cost of the semiconductor device 10 can be reduced since the number of component parts and the number of joining steps can be reduced.

Embodiment 3

Figure 10:
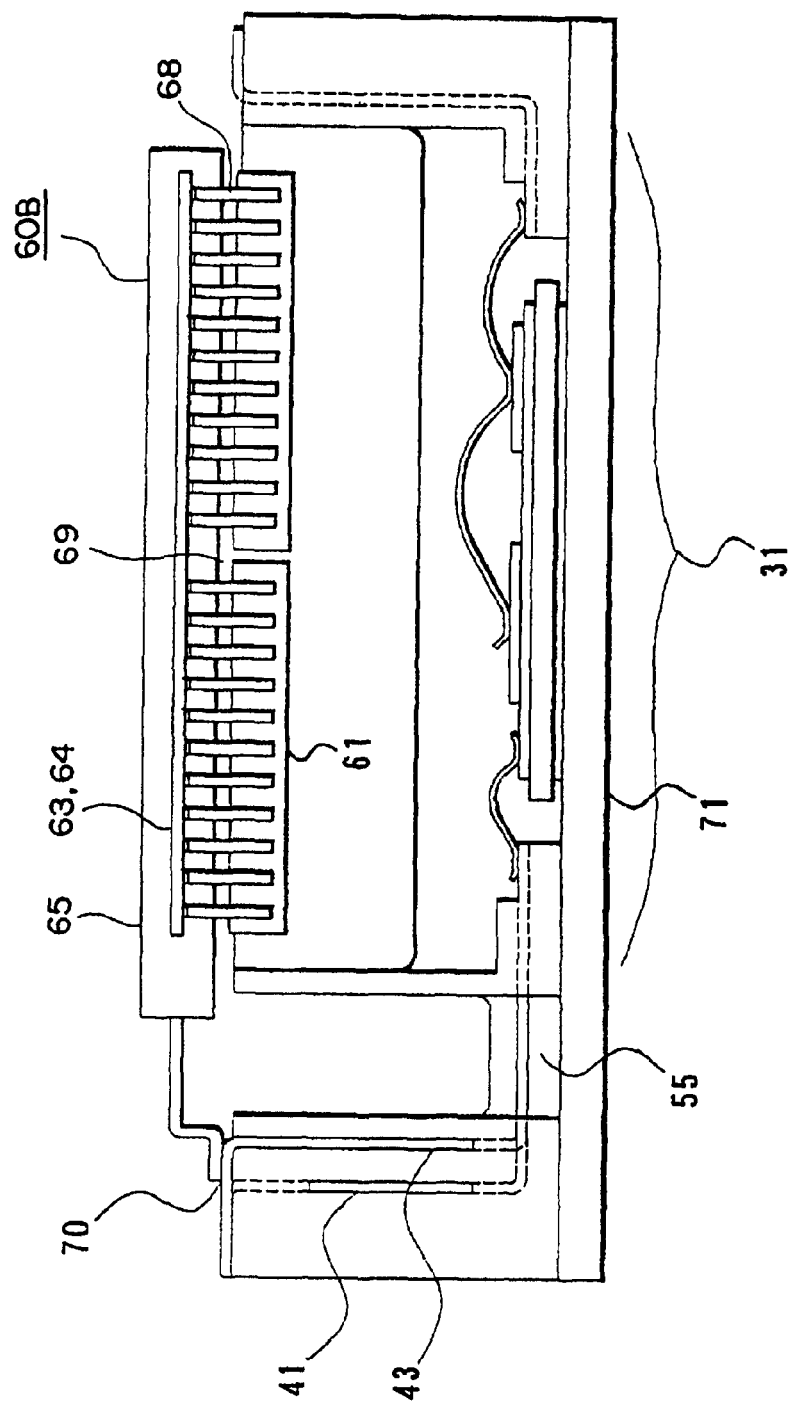
FIG. 10 is a sectional side view of a structure of a semiconductor device in Embodiment 3 of the present invention.

FIG. 10 is a sectional side view of the structure of a semiconductor device in Embodiment 3 of the present invention. In the structure of this embodiment, a capacitor module 60B is placed above the power converter circuit unit 31 and is welded to the P-polarity conductor 41 and the N-polarity conductor 43 at the connection 70, as shown in FIG. 10. In this way, the capacitor module 60B and the P-polarity and N-polarity conductors 41 and 43 are thereby connected electrically and thermally. Heat generated by the capacitor 61 is conducted to the P-polarity and N-polarity connection conductors 63 and 64 through the terminal members 68, the synthetic resin 65 and the underfill 69, further to the P-polarity and N-polarity conductors 41 and 43 through the connections 70, and to the heat radiation plate 71 through the insulating resin 55. The heat conducted to the heat radiation plate 71 is cooled by a cooling means (not shown) provided below the heat radiation plate 71. Therefore a resin having a high thermal conductivity is preferably used as the insulating resin 55. Note that the capacitor module 60B is supported by means not illustrated in the figure and may be supported by a method freely selected. The capacitor module 60B may also be used as a cover for the semiconductor device 10.

In this embodiment, the ceramic capacitor 61 is supported on the molded wiring plate formed of the synthetic resin 65. Therefore no excessive load is imposed on the terminal members 68 low in rigidity under any layout condition and the degree of freedom of placing the ceramic capacitor 61 is improved. Consequently, the size of the semiconductor device 10 can be reduced.

Embodiment 4

Figure 11:
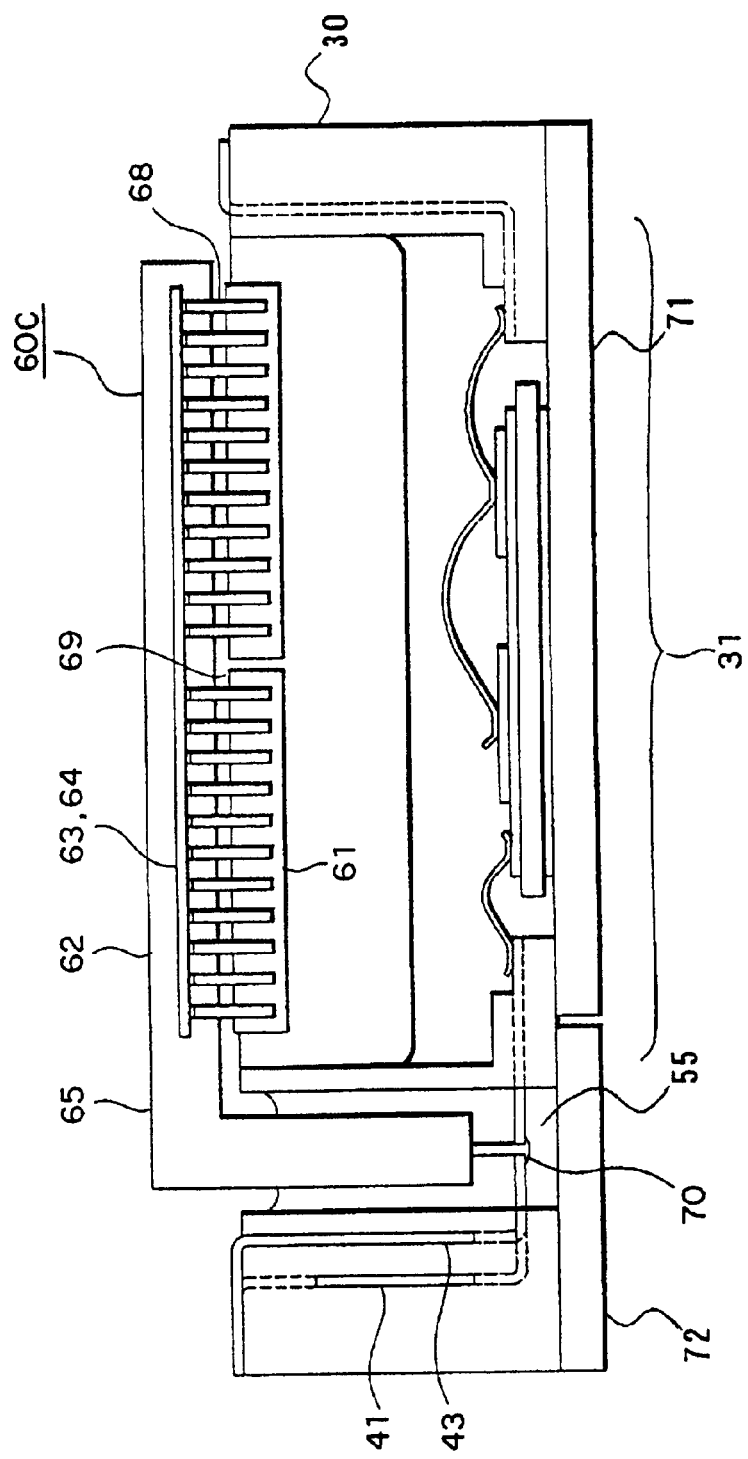
FIG. 11 is a sectional side view of the structure of a semiconductor device in Embodiment 4 of the present invention.

FIG. 11 is a sectional side view of the structure of a semiconductor device in Embodiment 4 of the present invention. In this embodiment, the molded wiring plate 62 of a capacitor module 60C is formed so as to be L-shaped and the ceramic capacitor 61 is placed above the power converter circuit unit 31, as shown in FIG. 11. The capacitor module 60C is welded to the P-polarity conductor 41 and the N-polarity conductor 43 at the connection 70. The capacitor module 60C and the P-polarity and N-polarity conductors 41 and 43 are thereby connected electrically and thermally. Heat radiation plates 71 and 72 are placed under the case 30. Heat generated by the capacitor 61 is conducted to the P-polarity and N-polarity connection conductors 63 and 64 through the terminal members 68, the synthetic resin 65 and the underfill 69, further to the P-polarity and N-polarity conductors 41 and 43 through the connections 70, and to the heat radiation plate 72 through the insulating resin 55. The heat radiation plate 72 is cooled by a cooling means (not shown) provided below the heat radiation plate 72. Therefore, a resin having high thermal conductivity is preferably used as the insulating resin 55. In this embodiment, an epoxy resin is used as the insulating resin 55 to support the molded wiring plate 62. The space around the molded wiring plate 62 is filled with the resin up to a level in the vicinity of the upper surface of the case 30. A description of the epoxy resin will be made below. Note that the described method of supporting the molded wiring plate 62 is not exclusively used and any other supporting method may be used. Further, the capacitor module 60C may also be used as a cover for the semiconductor device 10.

In this embodiment, the ceramic capacitor 61 can be placed above the power converter circuit unit 31, so that the size of the semiconductor device 10 can be reduced.

Embodiment 5

Figure 12:
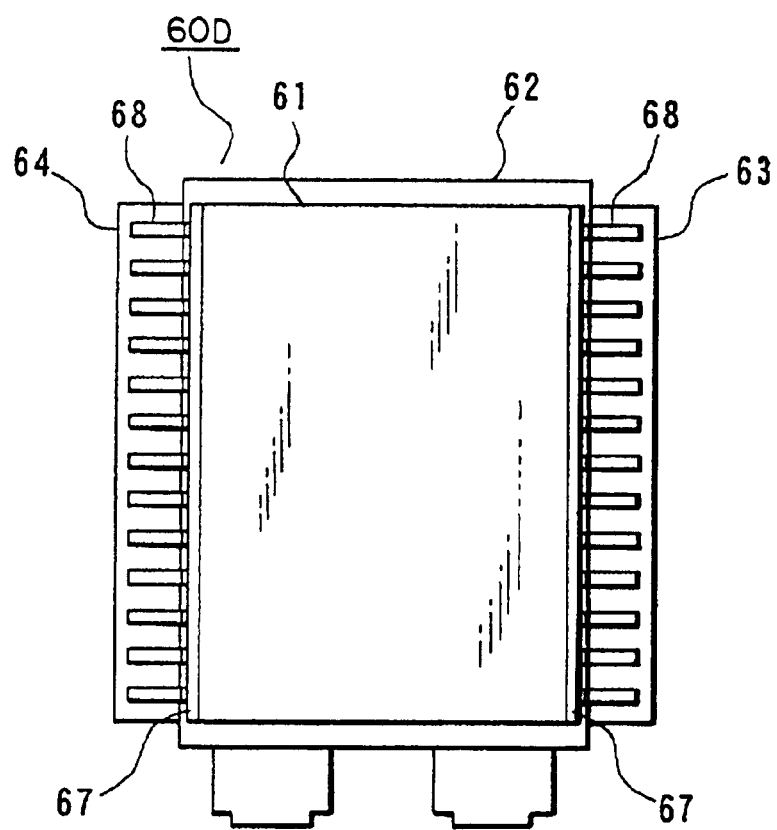
FIG. 12 is a front view of a structure of a capacitor module 60 in Embodiment 5 of the present invention.
Figure 13:
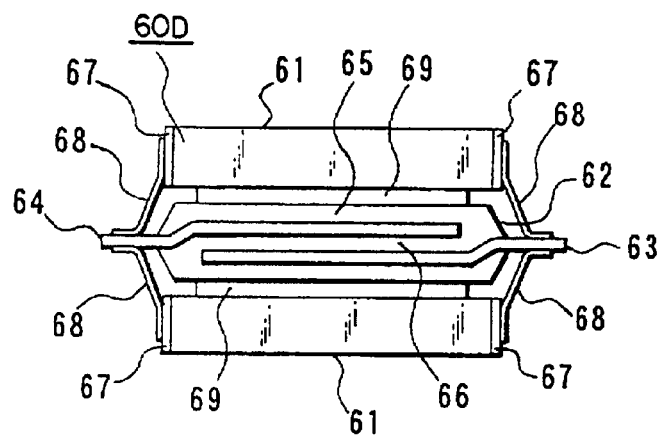
FIG. 13 is a sectional top view of the structure of the capacitor module 60 in Embodiment 5 of the present invention.
Figure 14:
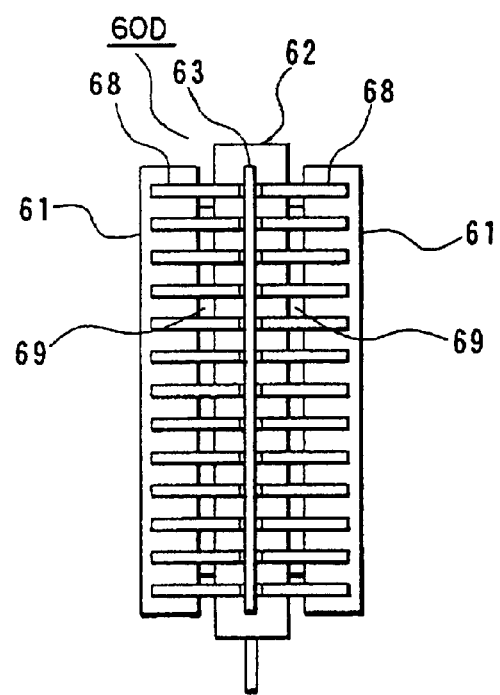
FIG. 14 is a side view of the structure of the capacitor module 60 in Embodiment 5 of the present invention.

FIG. 12 is a front view of the structure of a capacitor module 60D in Embodiment 5 of the present invention. FIG. 13 is a sectional view of the capacitor module seen from above, and FIG. 14 is a side view of the capacitor module. In this embodiment, as shown in FIGS. 12, 13, and 14, the P-polarity connection conductor 63 and the N-polarity connection conductor 64 are formed and placed so as to overlap with each other and so as to extend parallel and close to each other (while being spaced by a predetermined distance from each other).

In this embodiment, currents flow through the P-polarity connection conductor 63 and the N-polarity connection conductor 64 in opposite directions to cancel out magnetic fields, thereby reducing the inductance. Also, since the sectional area of each of the P-polarity connection conductor 63 and the N-polarity connection conductor 64 can be increased, the thermal resistance of the heat-transfer path for cooling the capacitor 61 can be reduced, thereby improving the ability to cool the ceramic capacitor 61. Therefore it is possible to reduce the size of the capacitor and, hence, the size of the semiconductor device. Needless to say, while an example of application of the structure of this embodiment to the first embodiment has been described, the same effect can also be achieved in an application to the second or third embodiment.

Embodiment 6

Figure 15:
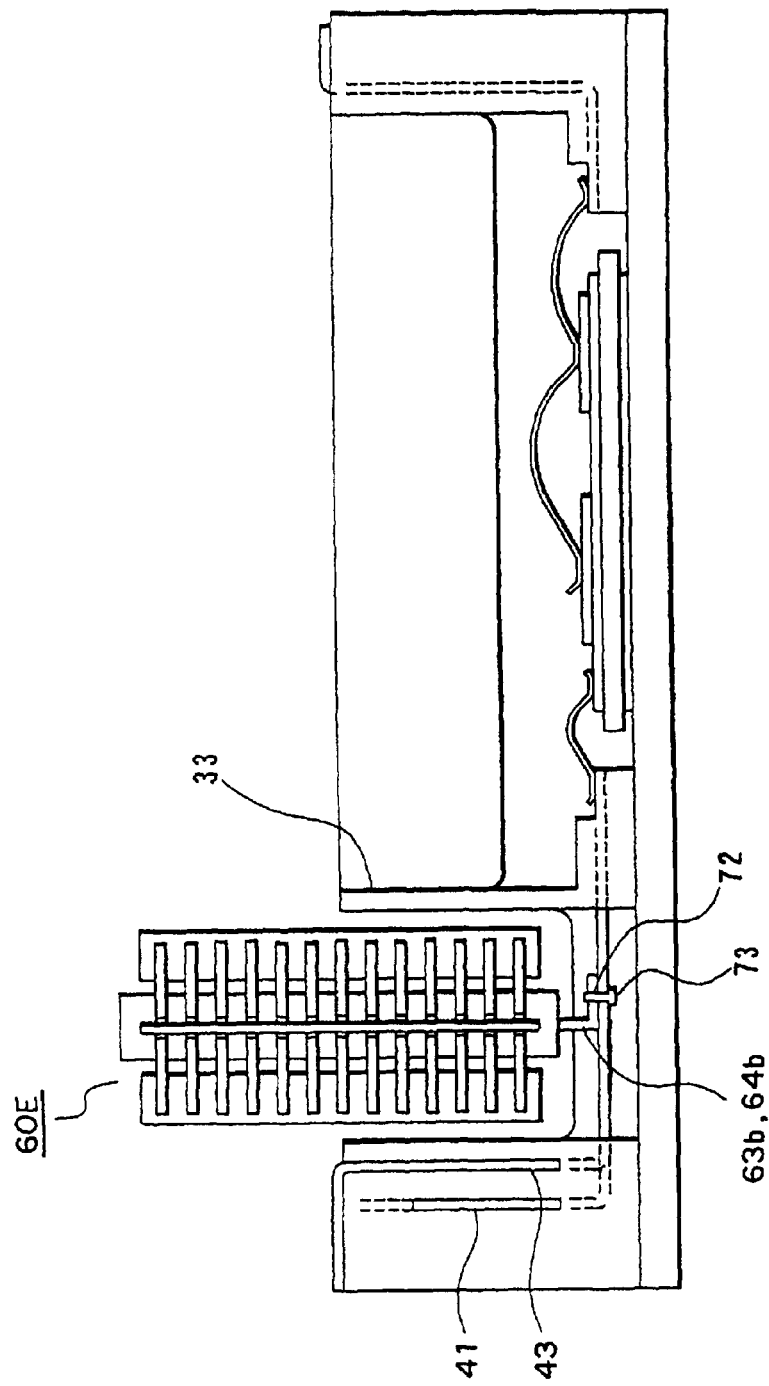
FIG. 15 is a sectional side view of the structure of a semiconductor device in Embodiment 6 of the present invention.

FIG. 15 is a sectional side view of the structure of a semiconductor device in Embodiment 6 of the present invention. In the structure of this embodiment, as shown in FIG. 15, each of the portions of the P-polarity connection conductor 63 and the N-polarity connection conductor 64 exposed at the lower end of a capacitor module 60E is bent so as to be L-shaped and the horizontal portion in the L-shaped portion is brought into contact with the P-polarity conductor 41 or the N-polarity conductor 43 in a surface contact manner. A threaded hole 72 is formed in the horizontal portion in the L-shaped portion to enable the conductor to be fastened to the case 30 with a screw 73 inserted from the bottom surface side of the case 30. The contact surfaces of the horizontal portion in each L-shaped portion and the corresponding P-polarity or N-polarity conductor 41 or 43 are adhered to each other by an axial force of the screws to ensure electrical and thermal conduction therebetween.

In this embodiment, as described above, the capacitor module 60E and the P-polarity and N-polarity conductors 41 and 43 contact each other in a surface contact manner. The heat-transfer area is thereby increased to reduce the thermal resistance of the connection and to thereby improve the ability to cool the ceramic capacitor 61. Therefore it is possible to reduce the size of the capacitor and, hence, the size of the semiconductor device. Since the P-polarity and N-polarity connection conductors 63 and 64 are fixed to the P-polarity and N-polarity conductors 41 and 43 by fastening with screws, it is possible to enable change and reuse of the capacitor module 60 by removing the screws.

Embodiment 7

Figure 16:
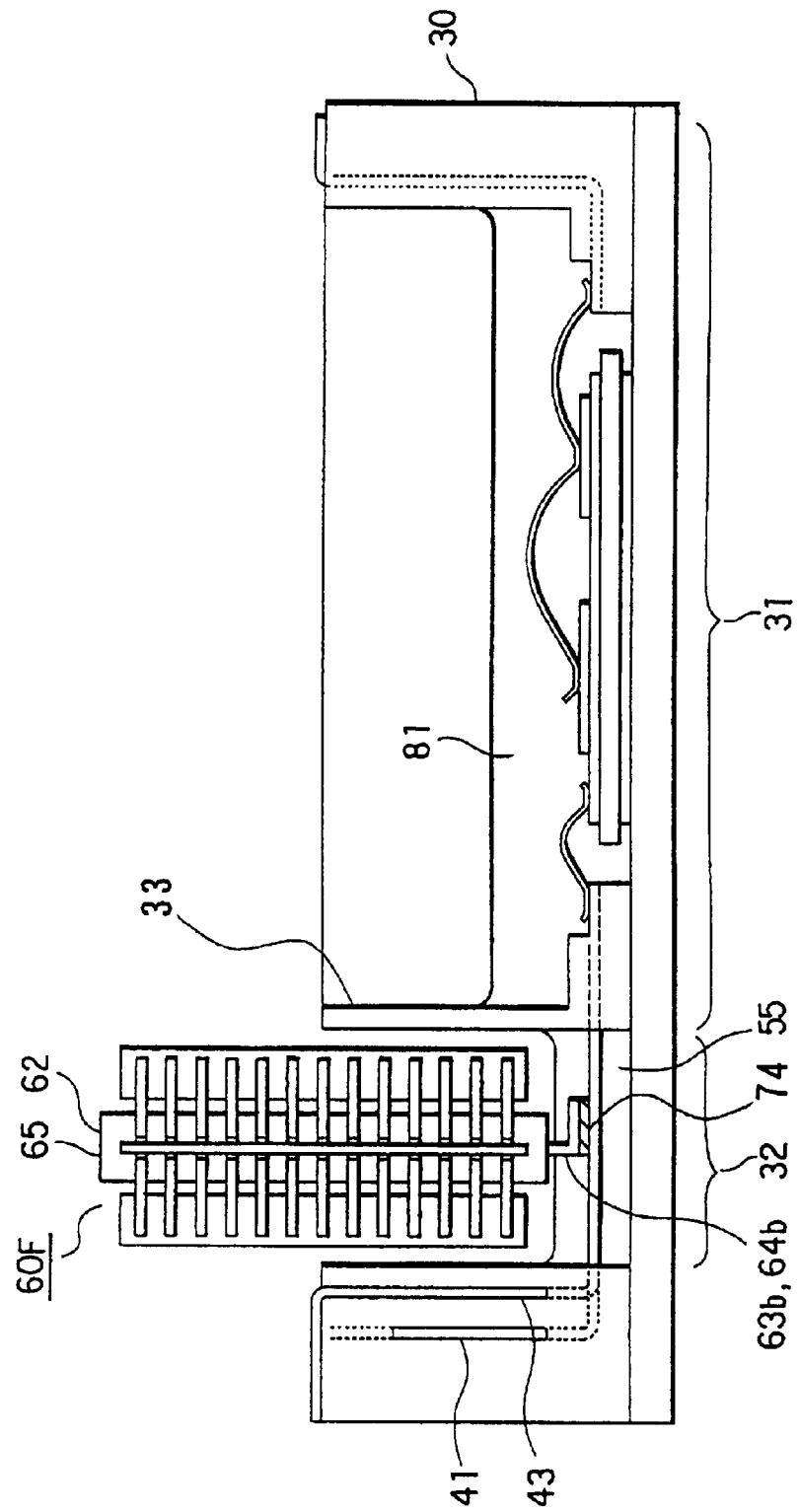
FIG. 16 is a sectional side view of the structure of a semiconductor device in Embodiment 7 of the present invention.

FIG. 16 is a sectional side view of the structure of a semiconductor device in Embodiment 7 of the present invention. In this embodiment, a capacitor module 60F is fixed to the P-polarity conductor 41 and the N-polarity conductor 43 by an electroconductive fixing material 74 having a high thermal conductivity, as shown in FIG. 16. Also in this embodiment, each of the portions of the P-polarity connection conductor 63 and the N-polarity connection conductor 64 exposed at the lower end of a capacitor module 60F is bent so as to be L-shaped as in the above-mentioned fastening with screws. The horizontal portions in the L-shaped portions thus formed are fixed to the P-polarity and N-polarity conductors 41 and 43 by an electroconductive fixing material 74 having high thermal conductivity, e.g., solder or a silver paste prepared by mixing a silver filer in a resin such as an epoxy resin. To perform soldering or bonding with a silver paste, a heating step is required. Therefore a heat resistant resin such as PPS is used as the synthetic resin 65 forming the case 30 and the molded wiring plate 62. If excessive stress is caused in the fixing portion formed by the solder or the silver paste, there is a fear of the fixing portion being broken. Therefore the capacitor unit 32 is filled with an epoxy resin selected as the insulating resin 55 to prevent occurrence of excessive stress in the bonding portion as well as to ensure insulation. On the other hand, the power converter circuit unit 31 separated from the capacitor unit 32 by the partition member 33 is filled with the insulating resin 81 selected from those ordinarily used in order to ensure insulation.

In this embodiment, as described above, the surfaces of the capacitor module 60F and the P-polarity and N-polarity conductors 41 and 43 are bonded to each other in their surfaces by the electroconductive adhesive 74 having high thermal conductivity. The heat-transfer area is thereby increased to reduce the thermal resistance of the connection and to thereby improve the ability to cool the ceramic capacitor 61. Therefore it is possible to reduce the size of the capacitor and, hence, the size of the semiconductor device.

Embodiment 8

Figure 17:
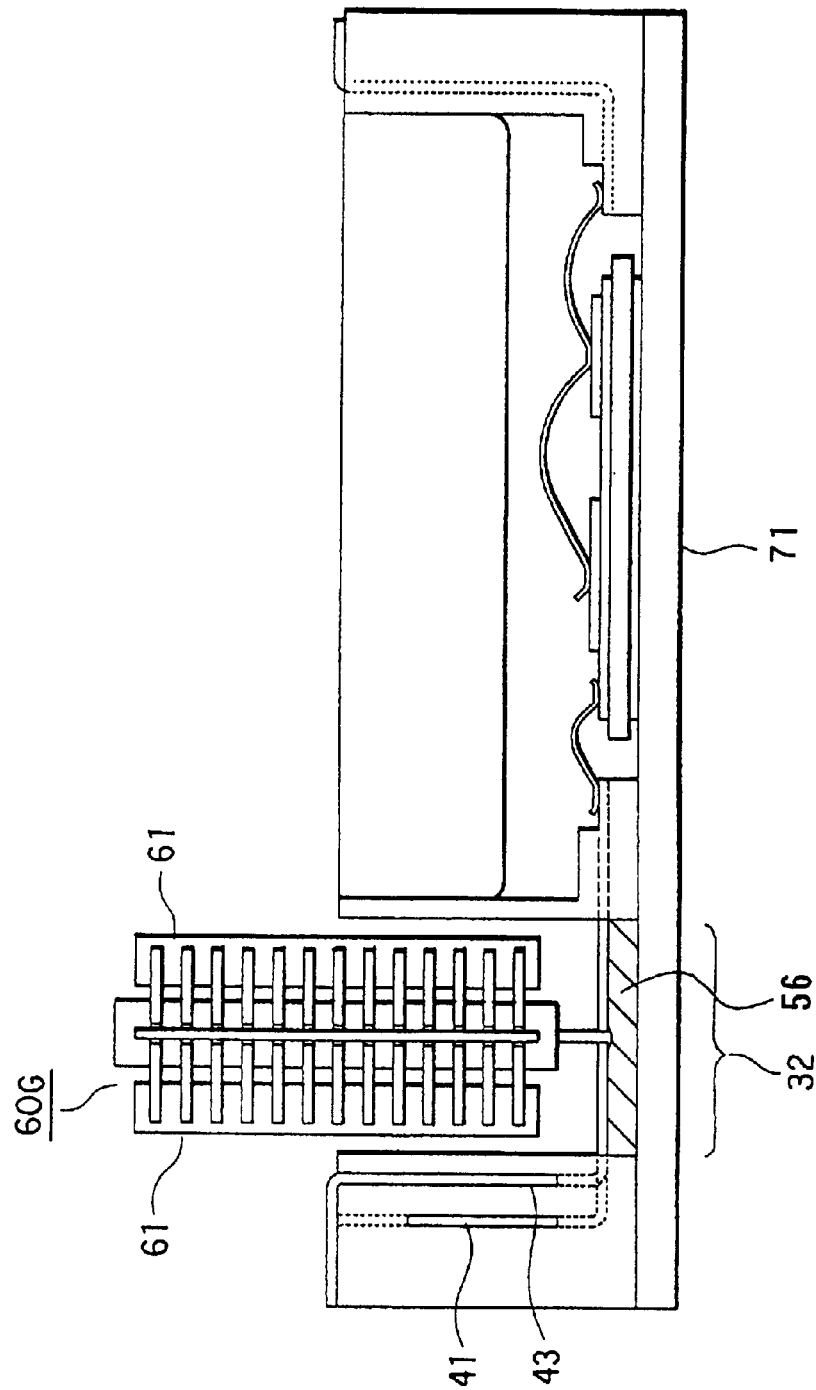
FIG. 17 is a sectional side view of a structure of a semiconductor device in Embodiment 8 of the present invention.
Figure 18:
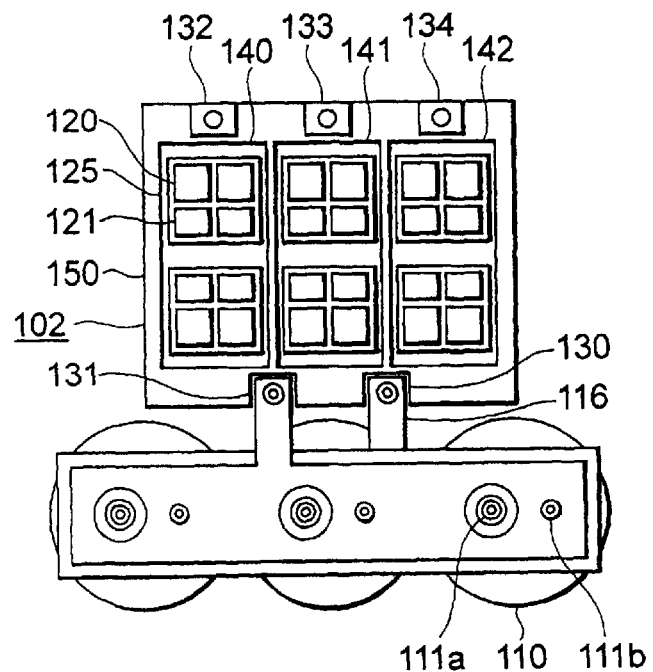
FIG. 18 is a top perspective view of a structure of a conventional inverter.
Figure 19:
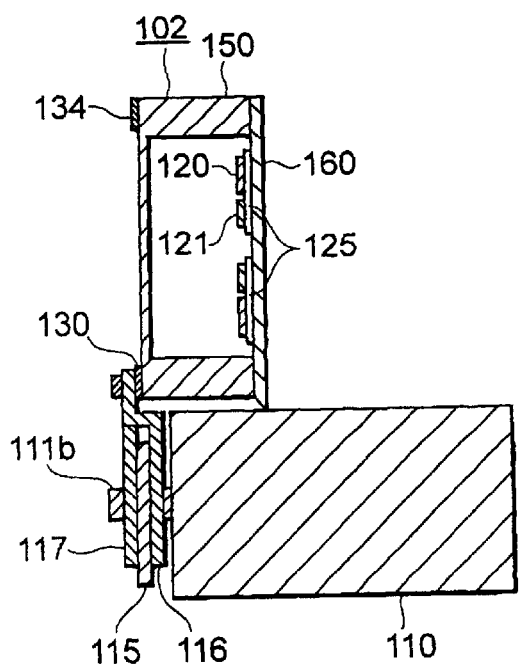
FIG. 19 is a sectional side view of the structure of the conventional inverter.
Figure 20:
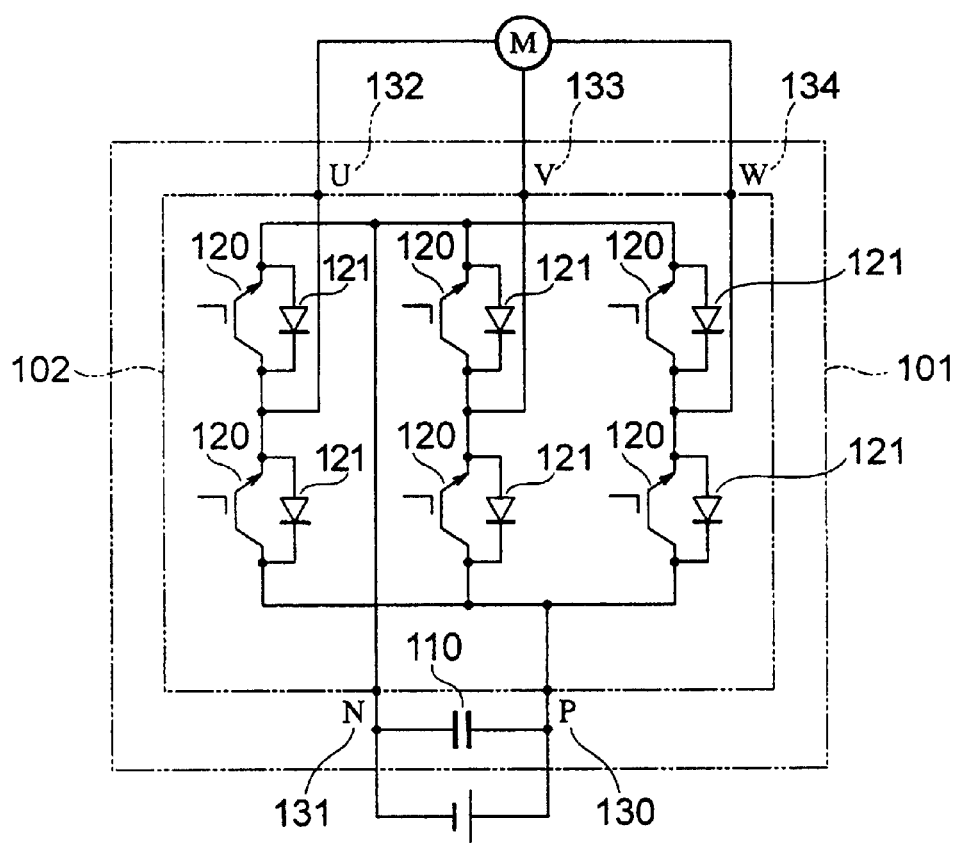
FIG. 20 is a circuit diagram of the conventional inverter.
Figure 22:
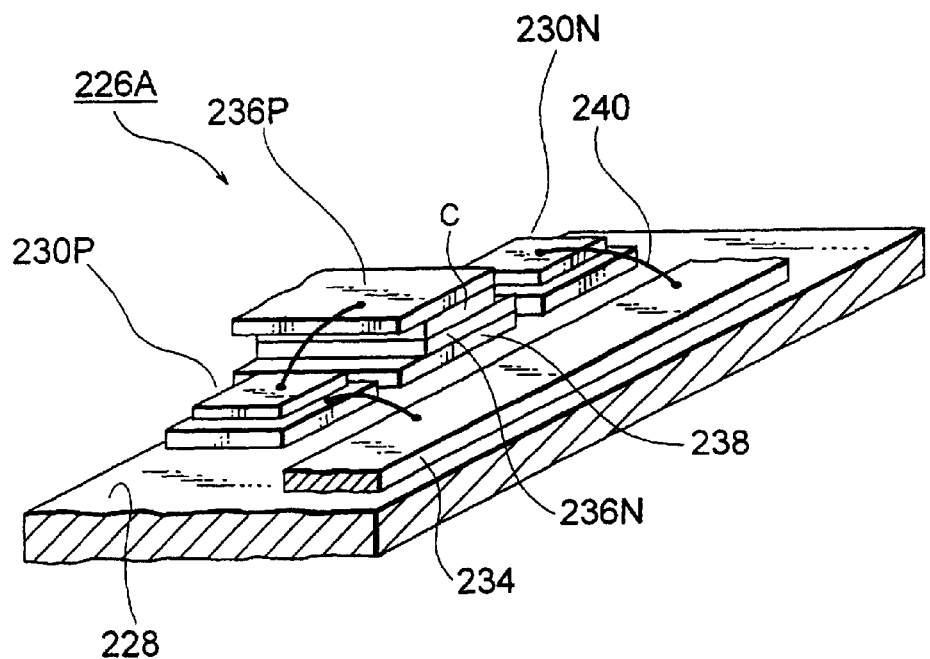
FIG. 22 is a perspective view of an example of a switching device board configuration in the conventional inverter shown in FIG. 21.
Figure 23:
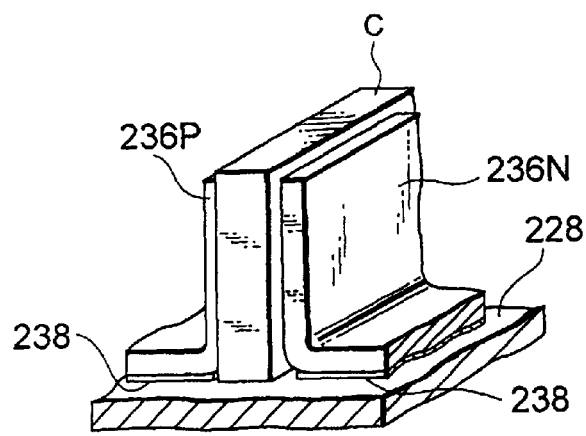
FIG. 23 is a perspective view of an example of modification of the switching device board configuration in the conventional inverter shown in FIG. 21.

FIG. 17 is a sectional side view of the structure of a semiconductor device in Embodiment 8 of the present invention. In the structure of this embodiment, a silicone rubber sheet 56 is interposed between the P-polarity and N-polarity conductors 41 and 43 and the heat radiation plate 71, as shown in FIG. 17. If the content of a filler mixed in the silicone gel is increased to improve the thermal conductivity, the viscosity of the silicone gel compound becomes so high that it is difficult to fill the capacitor unit 32 with the silicone gel compound. Therefore there is a limitation to the improvement in thermal conductivity. A silicone rubber sheet is provided in a state of being set in advance and the content of a filler mixed can therefore be increased at the production without considering the viscosity to achieve thermal conductivity higher than that of the silicone gel. The silicone rubber sheet 56 having such high thermal conductivity and having a thickness slightly larger than the spacing between the P-polarity and N-polarity conductors 41 and 43 and the heat radiation plate 71 is interposed between the P-polarity and N-polarity conductors 41 and 43 and the heat radiation plate 71. When the case 30 and the heat radiation plate 71 are tightly fixed to each other by fastening with screws or by bonding with adhesive, the silicone rubber sheet 56 is adhered to the P-polarity and N-polarity conductors 41 and 43, thus obtaining good thermal conductivity. In this embodiment, the ability to cool the ceramic capacitor 61 is improved to make it possible to reduce the size of the capacitor and, hence, the size of the semiconductor device. Further, since the silicone rubber sheet 56 is only interposed between the P-polarity and N-polarity conductors 41 and 43 and the heat radiation plate 71, the case 30 and the heat radiation plate 71 may be separated to enable the silicone rubber sheet 56 to be taken out. That is, silicone rubber sheet 56 can be reused after being taken out of a defective, malfunctioning or broken article which is produced in the manufacturing process, and which cannot be repaired.

Embodiment 9

A semiconductor device in Embodiment 9 of the present invention will be described. In this embodiment, an epoxy resin is used as the insulating resin 55 with which the capacitor unit 32 is filled. The epoxy resin becomes markedly hard after setting in comparison with silicone gel. If the connection 70 connecting the capacitor module 60 and the P-polarity and N-polarity conductors 41 and 43 is covered with the epoxy resin, occurrence of excessive stress in the connection 70 can be prevented when the connected components are caused to vibrate, thus improving the resistance of the semiconductor device to vibration. Also, when filling an epoxy resin up to a level in the vicinity of the upper surface of the case 30, it is possible to suppress vibration of the capacitor module 60 and to further improve the vibration resistance. Epoxy resins are low-priced in comparison with silicone gel and the manufacturing cost of the semiconductor device can be reduced if an epoxy resin is used. Also, epoxy resins prepared without any particular means for improving the thermal conductivity have thermal conductivity higher than that of ordinary silicone gel in which no high-thermal-conductivity filler is mixed. It is also possible to improve the thermal conductivity of an epoxy resin by mixing a high-thermal-conductivity filler.

In this embodiment, the ability to cool the ceramic capacitor 61 can be improved to achieve a reduction in size of the capacitor and, hence, a reduction in size of the semiconductor device. It is also possible to improve the vibration resistance of the semiconductor device while reducing the manufacturing cost of the semiconductor device.

What is claimed is:

1. A capacitor module comprising:
   a ceramic capacitor having major surfaces facing in opposite directions, side surfaces facing in other opposite directions, and external electrodes respectively provided on the side surfaces facing in other opposite directions;
   terminal members respectively joined to the external electrodes of said ceramic capacitor, said terminal members having electrical conductivity and flexibility;
   a P-polarity connection conductor which connects said terminal member on one side of said ceramic capacitor to a P-polarity conductor provided outside;
   an N-polarity connection conductor which connects said terminal member on the other side of said ceramic capacitor to an N-polarity conductor provided outside; and
   a wiring plate provided with said P-polarity connection conductor and said N-polarity connection conductor, the major surface of said ceramic capacitor being supported on said wiring plate;
   wherein a flexible member is disposed between said ceramic capacitor and said wiring plate.

2. A capacitor module according to claim 1, wherein each of said P-polarity connection conductor and said N-polarity connection conductor is formed integrally with said terminal member.

3. A capacitor module according to claim 1, wherein said P-polarity connection conductor and said N-polarity connection conductor are placed parallel to each other by being spaced apart by a predetermined distance, with an insulating layer disposed therebetween.

4. A capacitor module according to claim 1, wherein said wiring plate is formed of a synthetic resin which is molded so that said P-polarity connection conductor and said N-polarity connection conductor are embedded in and integrally combined with the synthetic resin.

5. A capacitor module according to claim 1, wherein said external electrodes of said ceramic capacitor or said terminal members connected to said external electrodes are jointed to said P-polarity connection conductor and said N-polarity connection conductor by solid phase joining.

6. A semiconductor device comprising:
   a power converter circuit constituted by switching devices and diodes and having a plurality of phases;
   a P-polarity conductor and an N-polarity conductor for supplying electric power to the respective phases of said power converter circuit;
   a capacitor module connected to said P-polarity conductor and said N-polarity conductor;
   a case in which said power converter circuit, said P-polarity conductor, said N-polarity conductor, and said capacitor module are accommodated;
   a heat radiation plate provided at a bottom of said case; and
   an insulating resin with which at least said power converter circuit is covered,
   wherein said capacitor module comprises:
      a ceramic capacitor having major surfaces facing in opposite directions, side surfaces facing in other opposite directions, and external electrodes respectively provided on the side surfaces facing in other opposite directions;
      terminal members respectively joined to the external electrodes of said ceramic capacitor, said terminal members having electrical conductivity and flexibility;
      a P-polarity connection conductor which connects said terminal member on one side of said ceramic capacitor to said P-polarity conductor;
      an N-polarity connection conductor which connects said terminal member on the other side of said ceramic capacitor to said N-polarity conductor; and
      a wiring plate provided with said P-polarity connection conductor and said N-polarity connection conductor, the major surface of said ceramic capacitor being supported on said wiring plate;
   wherein a flexible member is disposed between said ceramic capacitor and said wiring plate.

7. A semiconductor device according to claim 6, wherein each of said P-polarity connection conductor and said N-polarity connection conductor is formed integrally with said terminal member.

8. A semiconductor device according to claim 6, further comprising a partition member provided in said case to separate a region for said power converter circuit and a region for said ceramic capacitor from each other.

9. A semiconductor device according to claim 8, wherein an insulating member for thermal connection between said P-polarity and N-polarity conductors and said heat radiation plate is provided at least between said P-polarity and N-polarity conductors and said heat radiation plate in the region for said ceramic capacitor partitioned by said partition member.

10. A semiconductor device according to claim 9, wherein said insulating member comprises a silicone rubber sheet.

11. A semiconductor device according to claim 9, wherein said insulating member is an epoxy resin.

12. A semiconductor device according to claim 6, wherein said P-polarity connection conductor and said N-polarity connection conductor are placed parallel to each other by being spaced apart by a predetermined distance, with an insulating layer provided therebetween.

13. A semiconductor device according to claim 6, wherein said wiring plate is formed of a synthetic resin which is molded so that said P-polarity connection conductor and said N-polarity connection conductor are embedded in and integrally combined with the synthetic resin.

14. A semiconductor device according to claim 6, wherein the external electrodes of said ceramic capacitor or said terminal members connected to the external electrodes are jointed to said P-polarity connection conductor and said N-polarity connection conductor by solid phase joining.

15. A semiconductor device according to claim 6, wherein said P-polarity connection conductor and said N-polarity connection conductor are screwed to said P-polarity conductor and said N-polarity conductor directly or with an electroconductive connection member provided therebetween.

16. A semiconductor device according to claim 6, wherein said P-polarity connection conductor and said N-polarity connection conductor are fixed by an electroconductive fixing material having thermal conductivity to said P-polarity conductor and said N-polarity conductor directly or with an electroconductive connection member provided therebetween.

17. A semiconductor device according to claim 6, wherein said P-polarity connection conductor and said N-polarity connection conductor are welded to said P-polarity conductor and said N-polarity conductor directly or with an electroconductive connection member provided therebetween.

* * * * *